United States Patent
Gaewsky et al.

(10) Patent No.: US 10,340,024 B2
(45) Date of Patent: Jul. 2, 2019

(54) SOLID STATE DRIVE PHYSICAL BLOCK REVECTORING TO IMPROVE CLUSTER FAILURE RATES

(71) Applicant: Intel Corporation, Santa Clara, CA (US)

(72) Inventors: Kristopher H. Gaewsky, El Dorado Hills, CA (US); Brian C. Romo, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/715,758

(22) Filed: Sep. 26, 2017

(65) Prior Publication Data
US 2019/0096507 A1    Mar. 28, 2019

(51) Int. Cl.
G06F 12/02      (2006.01)
G11C 29/00      (2006.01)
G06F 11/10      (2006.01)

(52) U.S. Cl.
CPC .......... *G11C 29/808* (2013.01); *G06F 11/108* (2013.01); *G06F 12/0246* (2013.01); *G06F 2212/1036* (2013.01)

(58) Field of Classification Search
CPC .................................................. G06F 11/108
See application file for complete search history.

(56) References Cited

U.S. PATENT DOCUMENTS

| | | | |
|---|---|---|---|
| 8,924,601 B2 | 12/2014 | Vogan et al. | |
| 2015/0339187 A1* | 11/2015 | Sharon | G11C 29/52 714/766 |
| 2018/0088856 A1* | 3/2018 | Yu | G06F 3/0604 |

OTHER PUBLICATIONS

Steve Larrivee, "Solid State Drive Primer #5—NAND Architecture—Planes and Die", retrieved from cactus-tech.com/resources/blog/details/solid-state-drive-primer-5-nand-architecture-planes-and-die, 6 pages.

Margaret Rouse, "disk striping", retrieved from searchstorage.techtarget.com/definition/disk-striping?vgnextfmt=print, Mar. 25, 2015, 2 pages.

\* cited by examiner

*Primary Examiner* — Edward J Dudek, Jr.
(74) *Attorney, Agent, or Firm* — Jordan IP Law, LLC

(57) ABSTRACT

Systems, apparatuses and methods may provide for technology to identify an initial data band that spans a plurality of memory dies and revectors the plurality of memory dies to stagger the initial data band across a plurality of modified data bands. In one example, the revector of the plurality of memory dies is conducted independently of any block defects detected in the initial data band.

24 Claims, 4 Drawing Sheets

US 10,340,024 B2

SOLID STATE DRIVE PHYSICAL BLOCK REVECTORING TO IMPROVE CLUSTER FAILURE RATES

TECHNICAL FIELD

Embodiments generally relate to memory structures.

BACKGROUND

Solid state drives (SSDs) may include multiple NAND dies containing memory arrays that are organized into logical blocks. An SSD data band may be a program element that spans multiple NAND dies. Thus, a given data band might be made up of the same block numbers across all NAND dies. Such a configuration may present a number of challenges with regard to reliability. More particularly, defects and intrinsic reliability risks may be greater (e.g., clustered) at the physical boundaries of the memory arrays. For example, array components located near the edge of a NAND die may be more prone to failure than other interior array components. As a result, data bands that include a high number of edge blocks may exhibit program status failures, erase failures, read failures, etc., at a greater rate. Indeed, some failures may be so severe that the information in the data band becomes unrecoverable.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figures 1, 2:
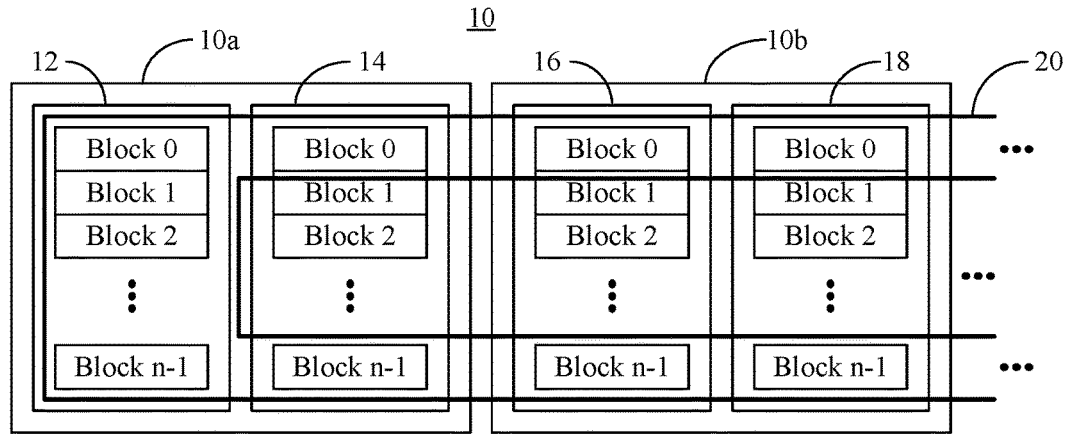
FIG. 1 is an illustration of an example of a plurality of memory dies according to an embodiment.
FIG. 2 is an illustration of an example of a revectoring scheme implemented at a block pair level according to an embodiment.

Turning now to FIG. 1, a plurality of memory dies 10 (10a, 10b, e.g., chips, semiconductor packages) are shown, wherein the memory dies 10 may generally be incorporated into a memory device such as, for example, a solid state drive (SSD). In the illustrated example, a first memory die 10a includes a first plane 12 containing a plurality of blocks (e.g., logical blocks) and a second plane 14 containing a plurality of blocks. Each block of the planes 12, 14 may include an array of bit lines (e.g., columns) and word lines (e.g., rows), as well as other memory components (e.g., string select line, ground select line, source line). The number of planes 12, 14 may vary depending on the circumstances. In one example, the planes 12, 14 may be programmed simultaneously. Similarly, a second memory die 10b includes a first plane 16 containing a plurality of blocks and a second plane 18 containing a plurality of blocks, wherein each block of the planes 16, 18 may include an array of bit lines and word lines, other memory components, and so forth. A subset 20 of the blocks located/positioned near the physical edge of the memory dies 10 may be intrinsically less reliable than other (e.g., interior) blocks on the memory dies 10.

As will be discussed in greater detail, a memory controller (not shown) may automatically revector the memory dies 10 so that data bands do not solely consist of blocks from the subset 20. Such an approach may effectively "dilute" the presence of edge blocks an any given data band. Accordingly, errors may be more recoverable (e.g., via error correction code/ECC techniques) and the overall reliability and/or performance of the computing system containing the memory device may be enhanced.

The memory dies 10 may include a NAND flash memory, three-dimensional (3D) NAND memory array, or other memory structure. Non-volatile memory is a storage medium that does not require power to maintain the state of data stored by the medium. In one embodiment, the memory dies 10 are a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In some embodiments, 3D crosspoint memory may comprise a transistorless stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

FIG. 2 shows a set of initial data bands 22 (e.g., "Band 0" to "Band 4") that span a plurality of memory dies 24 (e.g., "Die 0" to "XOR Die") and a set of modified data bands 26 (e.g., "Band 0" to "Band 4") that also span the plurality of memory dies 24. The modified data bands 26 may generally result from a revectoring of the initial data bands 22. In the illustrated example, each initial data band 26 is staggered across the modified data bands 26 at a block pair level. More particularly, each die may include two planes (e.g., "Plane 0" associated with a first block and "Plane 1" associated with a second block), wherein the data corresponding to the two planes is redirected to (e.g., replaced with) a different band in the modified data bands 26. Thus, the Die 1 A/A' block pair are redirected from Band 0 in the initial data bands 22 to Band 4 in the modified data bands 26, the Die 2 A/A' block pair are redirected from Band 0 in the initial data bands 22 to Band 3 in the modified data bands 26, and so forth. The staggering configuration may vary depending on the circumstances. Of particular note is that if the memory arrays in the blocks of the initial Band 0 happen to be positioned near a physical boundary (e.g., chip edge), the data in the initial Band 0 may be more recoverable after the revectoring because it is distributed across different bands in the set of modified data bands 26. The revectoring may also be performed on an XOR die that is used to conduct data recovery (e.g., ECC).

Additionally, the illustrated revectoring is conducted independently of any block defects detected in the set of initial data bands 22. Indeed, the enhanced reliability provided by the illustrated solution may effectively eliminate defects before they occur (e.g., preventing double ECC uncorrectables, improving annualized failure rates/AFR, reducing defects per million/DFM). Moreover, any external attempt to read/reconstruct die level data may be more difficult because the majority of block pairs will be staggered at the lowest system level (e.g., improving resilience). This security advantage may be significant because any NAND level attempt to reconstruct data would first have to identify the re-vector used to write the data. By contrast, under conventional approaches data may have been aligned across all die in the band on the same physical blocks.

Figure 3:
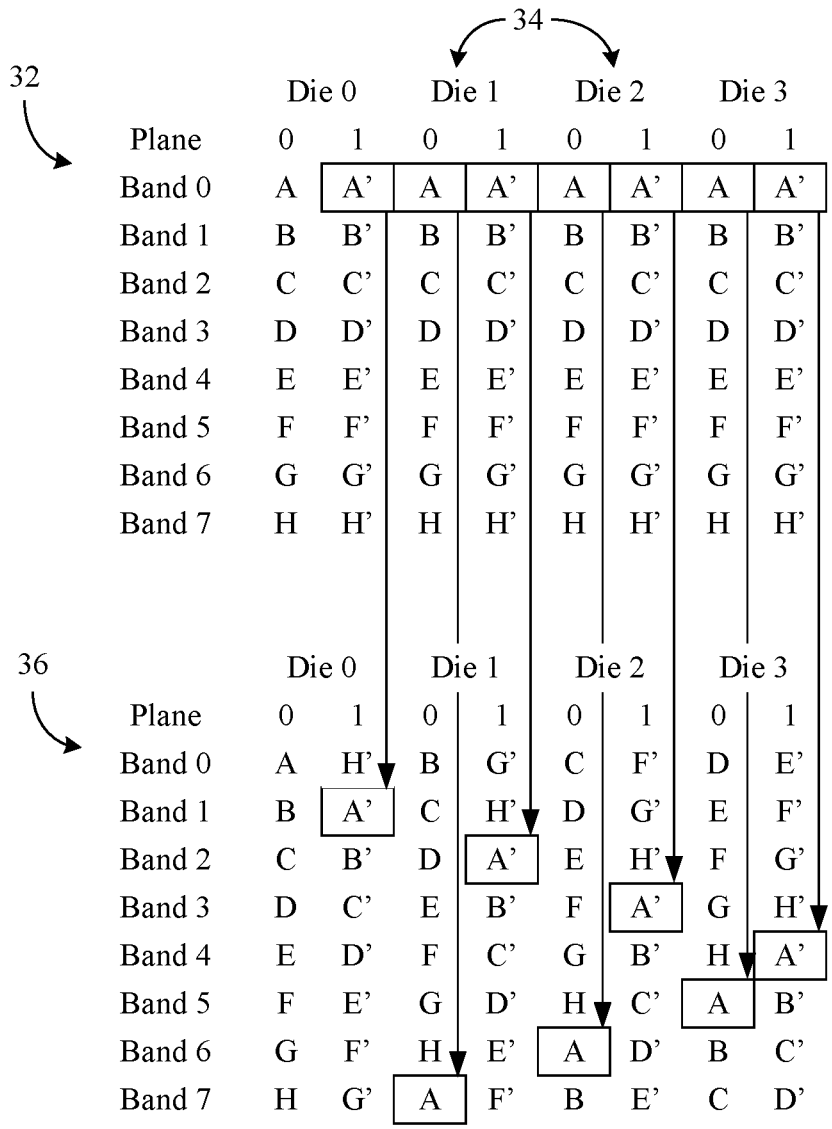
FIG. 3 is an illustration of an example of a revectoring scheme implemented at a plane level according to an embodiment.

Turning now to FIG. 3, a set of initial data bands 32 (e.g., "Band 0" to "Band 7") is shown, wherein the initial data bands 32 span a plurality of memory dies 34 (e.g., "Die 0" to "XOR Die"). The memory dies 34 may be revectored at a plane level to obtain a set of modified data bands 36 that also span the plurality of memory dies 34 in a staggered fashion. More particularly, each die may include two planes (e.g., "Plane 0" associated with a first block and "Plane 1" associated with a second block), wherein the data corresponding to each plane is redirected to a different band in the modified data bands 36. Thus, the Die 0 A' block is redirected from Band 0 in the initial data bands 32 to Band 1 in the modified data bands 36, the Die 1 A block is redirected from Band 0 in the initial data bands 32 to Band 7 in the modified data bands 36, the Die 1 A' block is redirected from Band 0 in the initial data bands 32 to Band 2 in the modified data bands 36, and so forth. The staggering configuration may vary depending on the circumstances. Again, if the memory arrays in the blocks in the initial Band 0 happen to be positioned near a physical boundary, the data in the initial Band 0 may be more recoverable after the revectoring because it is distributed across different bands in the set of modified data bands 36. The illustrated revectoring may also be conducted independently of any block defects detected in the set of initial data bands 32, as already discussed.

Figure 4:
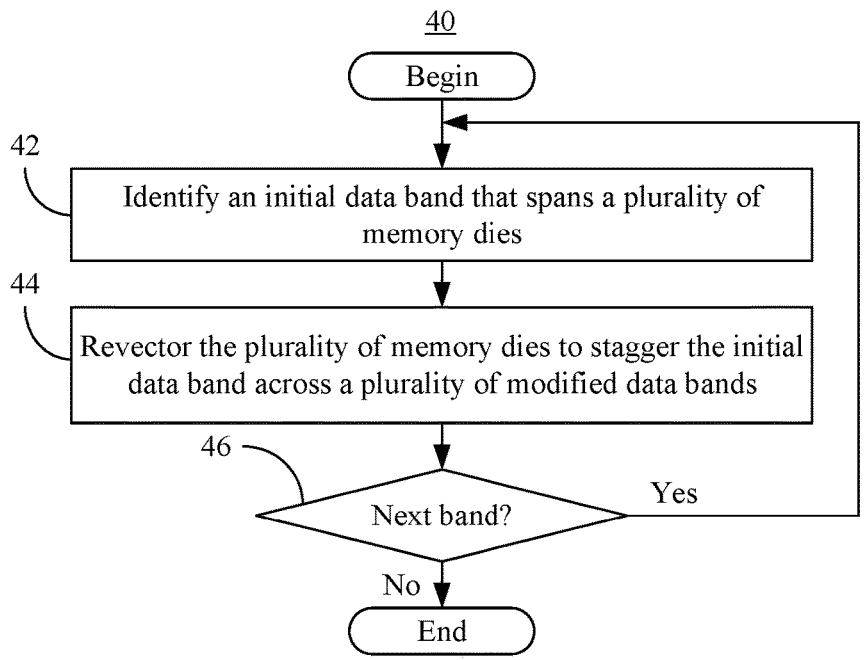
FIG. 4 is a flowchart of an example of a method of operating a memory controller according to an embodiment.

FIG. 4 shows a method 40 of operating a memory controller. The method 40 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 40 may be written in any combination of one or more programming languages, including an object oriented programming language such as Java, Smalltalk, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 42 provides for identifying an initial data band that spans a plurality of memory dies, wherein the plurality of memory dies may be revectored at processing block 44 to stagger the initial data band across a plurality of modified data bands. Processing block 44 may include staggering the initial data band across the memory dies at a block pair level, a plane level, and so forth. When the initial data band is staggered across the plurality of modified data bands at the block pair level, the revectoring may also include revectoring an XOR die. In one example, processing block 44 includes modifying a block lookup table to reflect the staggered configuration. Moreover, the revectoring of the memory dies may be conducted independently of any block defects detected in the initial data band. Thus, the illustrated solution may reduce failures during subsequent program, erase and/or read operations conducted with respect to the modified data band. A determination may be made at block 46 as to whether there are additional initial data bands to be revectored. If so, the illustrated method 40 repeats. Otherwise, the method 40 may terminate.

Figure 5:
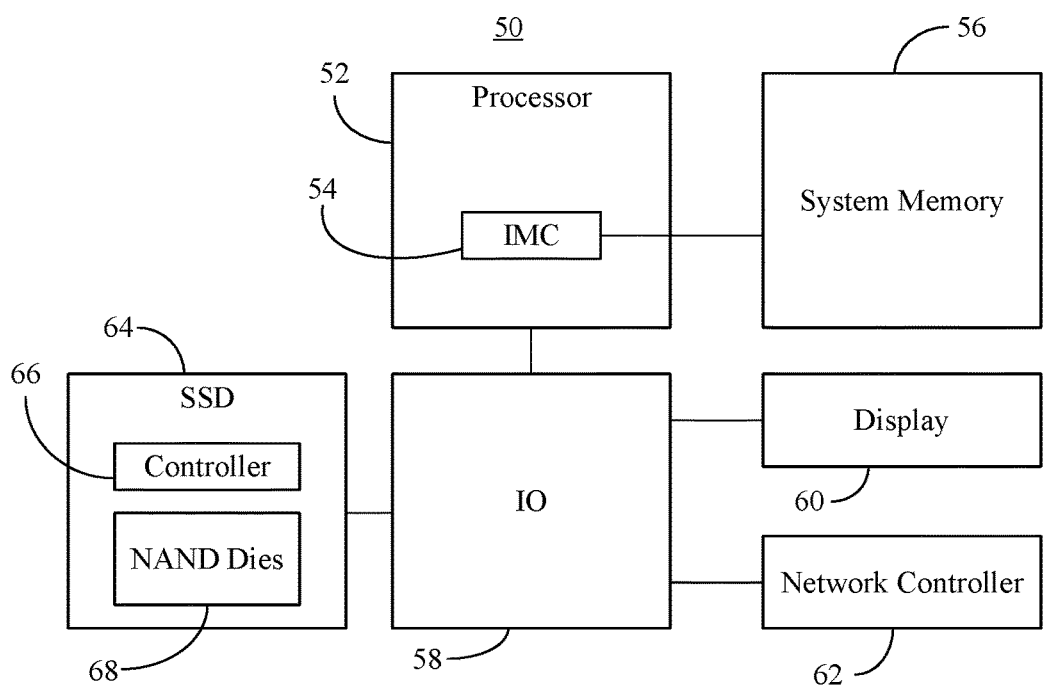
FIG. 5 is a block diagram of an example of a computing system according to an embodiment.

Turning now to FIG. 5, a reliability-enhanced computing system 50 is shown. The computing system 50 may generally be part of an electronic device/platform having computing functionality (e.g., personal digital assistant/PDA, notebook computer, tablet computer, server), communications functionality (e.g., smart phone), imaging functionality, media playing functionality (e.g., smart television/TV), wearable functionality (e.g., watch, eyewear, headwear, footwear, jewelry), vehicular functionality (e.g., car, truck, motorcycle), etc., or any combination thereof. In the illustrated example, the system 50 includes a host processor 52 (e.g., central processing unit/CPU) having an integrated memory controller (IMC) 54 that is coupled to a system memory 56.

The illustrated system 50 also includes an input output (IO) module 58 implemented together with the processor 52 on a semiconductor die (not shown) as a system on chip (SoC), wherein the IO module 58 functions as a host device and may communicate with, for example, a display 60 (e.g., touch screen, liquid crystal display/LCD, light emitting diode/LED display), a network controller 62, and an SSD 64. The illustrated SSD 64 includes a memory controller 66 and a plurality of NAND dies 68. The memory controller 66 may implement one or more aspects of the method 40 (FIG. 4) and the NAND dies 68 may include memory dies such as, for example, the memory dies 10 (FIG. 1), already discussed. Thus, the memory controller 66 may use logic (e.g., logic instructions, configurable logic, fixed-functionality hardware logic, etc., or any combination thereof) to identify initial data bands that span the NAND dies 68 and revector the NAND dies to obtain modified data bands that are staggered across blocks of the NAND dies. Revectoring the initial data bands may involve updating a lookup table to reflect the aforementioned staggering.

Figure 6:
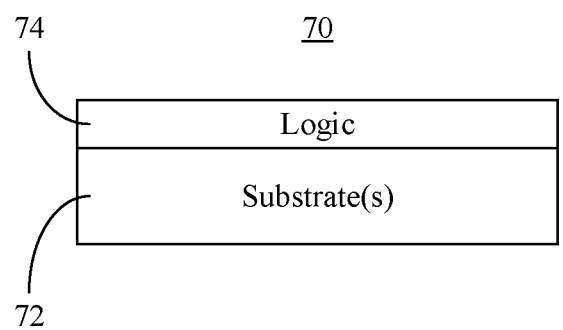
FIG. 6 is an illustration of an example of a semiconductor package apparatus according to an embodiment.

FIG. 6 shows a semiconductor package apparatus 70 (e.g., chip, die) that includes one or more substrates 72 (e.g., silicon, sapphire, gallium arsenide) and logic 74 (e.g., transistor array and other integrated circuit/IC components) coupled to the substrate(s) 72. The logic 74, which may be implemented in configurable logic and/or fixed-functionality hardware logic, may generally implement one or more aspects of the method 40 (FIG. 4), already discussed. Thus, the logic 74 may identify an initial data band that spans a plurality of memory dies and revector the plurality of memory dies to stagger the initial data band across a plurality of modified data bands.

ADDITIONAL NOTES AND EXAMPLES

Example 1 may include a reliability-enhanced computing system comprising a plurality of memory dies and a memory controller coupled to the plurality of memory dies, the memory controller including logic to identify an initial data band that spans the plurality of memory dies and revector the plurality of memory dies to stagger the initial data band across a plurality of modified data bands.

Example 2 may include the computing system of Example 1, wherein the revector of the plurality of memory dies is to be conducted independently of any block defects detected in the initial data band.

Example 3 may include the computing system of Example 1, wherein the initial data band is to be staggered across the plurality of modified data bands at a block pair level.

Example 4 may include the computing system of Example 3, wherein the plurality of memory dies includes an XOR die and the logic is to revector the XOR die.

Example 5 may include the computing system of Example 1, wherein the initial data band is to be staggered across the plurality of modified data bands at a plane level.

Example 6 may include the computing system of any one of Examples 1 to 5, wherein the logic is to repeat the revector for a plurality of initial data bands that span the plurality of memory dies.

Example 7 may include a semiconductor package apparatus comprising one or more substrates, and logic coupled to the one or more substrates, wherein the logic is implemented at least partly in configurable logic or fixed-functionality hardware logic, the logic coupled to the one or more substrates to identify an initial data band that spans a plurality of memory dies, and revector the plurality of memory dies to stagger the initial data band across a plurality of modified data bands.

Example 8 may include the semiconductor package apparatus of Example 7, wherein the revector of the plurality of memory dies is to be conducted independently of any block defects detected in the initial data band.

Example 9 may include the semiconductor package apparatus of Example 7, wherein the initial data band is to be staggered across the plurality of modified data bands at a block pair level.

Example 10 may include the semiconductor package apparatus of Example 9, wherein the logic coupled to the one or more substrates is to revector an XOR die.

Example 11 may include the semiconductor package apparatus of Example 7, wherein the initial data band is to be staggered across the plurality of modified data bands at a plane level.

Example 12 may include the semiconductor package apparatus of any one of Examples 7 to 11, wherein the logic coupled to the one or more substrates is to repeat the revector for a plurality of initial data bands that span the plurality of memory dies.

Example 13 may include a method of operating a memory controller, comprising identifying an initial data band that spans a plurality of memory dies, and revectoring the plurality of memory dies to stagger the initial data band across a plurality of modified data bands.

Example 14 may include the method of Example 13, wherein the revectoring of the plurality of memory dies is conducted independently of any block defects detected in the initial data band.

Example 15 may include the method of Example 13, wherein the initial data band is staggered across the plurality of modified data bands at a block pair level.

Example 16 may include the method of Example 15, wherein revectoring the plurality of memory dies includes revectoring an XOR die.

Example 17 may include the method of Example 13, wherein the initial data band is staggered across the plurality of modified data bands at a plane level.

Example 18 may include the method of any one of Examples 13 to 17, further including repeating the revectoring for a plurality of initial data bands that span the plurality of memory dies.

Example 19 may include at least one computer readable storage medium comprising a set of instructions, which when executed by a computing system, cause the computing system to identify an initial data band that spans a plurality of memory dies, and revector the plurality of memory dies to stagger the initial data band across a plurality of modified data bands.

Example 20 may include the at least one computer readable storage medium of Example 19, wherein the revector of the plurality of memory dies is to be conducted independently of any block defects detected in the initial data band.

Example 21 may include the at least one computer readable storage medium of Example 19, wherein the initial data band is to be staggered across the plurality of modified data bands at a block pair level.

Example 22 may include the at least one computer readable storage medium of Example 21, wherein the instructions, when executed, cause the computing system to revector an XOR die.

Example 23 may include the at least one computer readable storage medium of Example 19, wherein the initial data band is to be staggered across the plurality of modified data bands at a plane level.

Example 24 may include the at least one computer readable storage medium of any one of Examples 19 to 23, wherein the instructions, when executed, cause the computing system to repeat the revector for a plurality of initial data bands that span the plurality of memory dies.

Example 25 may include a memory controller comprising means for identifying an initial data band that spans a plurality of memory dies, and means for revectoring the plurality of memory dies to stagger the initial data band across a plurality of modified data bands.

Example 26 may include the memory controller of Example 25, wherein the revectoring of the plurality of memory dies is to be conducted independently of any block defects detected in the initial data band.

Example 27 may include the memory controller of Example 25, wherein the initial data band is to be staggered across the plurality of modified data bands at a block pair level.

Example 28 may include the memory controller of Example 27, wherein the means for revectoring the plurality of memory dies includes means for revectoring an XOR die.

Example 29 may include the memory controller of Example 25, wherein the initial data band is to be staggered across the plurality of modified data bands at a plane level.

Example 30 may include the memory controller of any one of Examples 25 to 29, further including means for repeating the revectoring for a plurality of initial data bands that span the plurality of memory dies.

Technology described herein may therefore reduce and/or eliminate quality of service (QoS) penalties associated with conducting ECC and/or XOR operations to recover data bands. Indeed, the technology may reduce the AFR of SSDs throughout the lifetime of the product. Additionally, development cycles may be shortened (e.g., resulting in faster product ramping) through fewer memory failures associated with cluster defect dependencies. Moreover, NAND manufacturing may experience improved yields because a larger percentage of edge blocks may be counted as being good. Thus, the overall system may be able to handle higher defectivity rates through edge band dilution.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
a plurality of memory dies; and
a memory controller coupled to the plurality of memory dies, the memory controller including logic to:
identify an initial data band that spans the plurality of memory dies, wherein the initial data band is to include two or more block units that are to be located in separate memory dies of the plurality of memory dies, and
revector the plurality of memory dies to stagger the initial data band across a plurality of modified data bands, wherein a total number of modified data bands to be used for the revector is to equal a total number of block units in the initial data band.

2. The computing system of claim 1, wherein the revector of the plurality of memory dies is to be conducted independently of any block defects detected in the initial data band, and wherein the logic is to redirect at least one edge data block located near a physical edge of a memory die to an interior data block of a modified data band.

3. The computing system of claim 1, wherein when the block unit is to include a block pair and the initial data band is to include two or more block pairs that are to be located in separate memory dies of the plurality of memory dies, the initial data band is to be staggered at a block pair level across the plurality of modified data bands to redirect the two or more block pairs to separate modified data bands and within a same memory die at which the two or more block pairs were located prior to the revector.

4. The computing system of claim 3, wherein the plurality of memory dies includes an XOR die and the logic is to revector the XOR die.

5. The computing system of claim 1, wherein when the block unit is to include a single block and the initial data band is to include two or more single blocks that are to be located in separate planes of a memory die and two or more single blocks that are to be located in separate planes of separate memory dies, the initial data band is to be staggered at a plane level across the plurality of modified data bands to redirect the single blocks to separate modified data bands and within a same plane and a same memory die at which the single blocks were located prior to the revector.

6. The computing system of claim 1, wherein the logic is to repeat the revector for a plurality of initial data bands that span the plurality of memory dies.

7. A semiconductor package apparatus comprising:
one or more substrates; and
logic coupled to the one or more substrates, wherein the logic is implemented at least partly in configurable logic or fixed-functionality hardware logic, the logic coupled to the one or more substrates to:
identify an initial data band that spans a plurality of memory dies, wherein the initial data band is to include two or more block units that are to be located in separate memory dies of the plurality of memory dies, and
revector the plurality of memory dies to stagger the initial data band across a plurality of modified data bands, wherein a total number of modified data bands to be used for the revector is to equal a total number of block units in the initial data band.

8. The semiconductor package apparatus of claim 7, wherein the revector of the plurality of memory dies is to be conducted independently of any block defects detected in the initial data band, and wherein the logic is to redirect at least one edge data block located near a physical edge of a memory die to an interior data block of a modified data band.

9. The semiconductor package apparatus of claim 7, wherein when the block unit is to include a block pair and the initial data band is to include two or more block pairs that are to be located in separate memory dies of the plurality of memory dies, the initial data band is to be staggered at a block pair level across the plurality of modified data bands to separate modified data bands and within a same memory die at which the two or more block pairs were located prior to the revector.

10. The semiconductor package apparatus of claim 9, wherein the logic coupled to the one or more substrates is to revector an XOR die.

11. The semiconductor package apparatus of claim 7, wherein when the block unit is to include a single block and the initial data band is to include two or more single blocks that are to be located in separate planes of a memory die and two or more single blocks that are to be located in separate planes of separate memory dies, the initial data band is to be staggered at a plane level across the plurality of modified data bands to redirect the single blocks to separate modified data bands and within a same plane and a same memory die at which the single blocks were located prior to the revector.

12. The semiconductor package apparatus of claim 7, wherein the logic coupled to the one or more substrates is to repeat the revector for a plurality of initial data bands that span the plurality of memory dies.

13. A method comprising:
identifying an initial data band that spans a plurality of memory dies, wherein the initial data band includes two or more block units that are located in separate memory dies of the plurality of memory dies; and
revectoring the plurality of memory dies to stagger the initial data band across a plurality of modified data bands, wherein a total number of modified data bands used for the revectoring is to equal a total number of block units in the initial data band.

14. The method of claim 13, wherein the revectoring of the plurality of memory dies is conducted independently of any block defects detected in the initial data band, and wherein the revectoring includes redirecting at least one edge data block located near a physical edge of a memory die to an interior data block of a modified data band.

15. The method of claim 13, wherein when the block unit includes a block pair and the initial data band includes two or more block pairs that are located in separate memory dies of the plurality of memory dies, the initial data band is staggered at a block pair level across the plurality of modified data bands to redirect the two or more block pairs to separate modified data bands and within a same memory die at which the two or more block pairs were located prior to the revector.

16. The method of claim 15, wherein revectoring the plurality of memory dies includes revectoring an XOR die.

17. The method of claim 13, wherein when the block unit includes a single block and the initial data band includes two or more single blocks that are located in separate planes of a memory die and two or more single blocks that are located in separate planes of separate memory dies, the initial data band is staggered at a plane level across the plurality of modified data bands to redirect the single blocks to separate modified data bands and within a same plane and a same memory die at which the single blocks were located prior to the revector.

18. The method of claim 13, further including repeating the revectoring for a plurality of initial data bands that span the plurality of memory dies.

19. At least one non-transitory computer readable storage medium comprising a set of instructions, which when executed by a computing system, cause the computing system to:
identify an initial data band that spans a plurality of memory dies, wherein the initial data band is to include two or more block units that are to be located in separate memory dies of the plurality of memory dies; and
revector the plurality of memory dies to stagger the initial data band across a plurality of modified data bands, wherein a total number of modified data bands to be used for the revector is to equal a total number of block units in the initial data band.

20. The at least one non-transitory computer readable storage medium of claim 19, wherein the revector of the plurality of memory dies is to be conducted independently of any block defects detected in the initial data band, and wherein the revector is to redirect at least one edge data block located near a physical edge of a memory die to an interior data block of a modified data band.

21. The at least one non-transitory computer readable storage medium of claim 19, wherein when the block unit is to include a block pair and the initial data band is to include two or more block pairs that are to be located in separate memory dies of the plurality of memory dies, the initial data band is to be staggered at a block pair level across the plurality of modified data bands to redirect the two or more block pairs to separate modified data bands and within a same memory die at which the two or more block pairs were located prior to the revector.

22. The at least one non-transitory computer readable storage medium of claim 21, wherein the instructions, when executed, cause the computing system to revector an XOR die.

23. The at least one non-transitory computer readable storage medium of claim 19, wherein when the block unit is to include a single block and the initial data band is to include two or more single blocks that are to be located in separate planes of a memory die and two or more single blocks that are to be located in separate planes of separate memory dies, the initial data band is to be staggered at a plane level across the plurality of modified data bands to redirect the single blocks to separate modified data bands and within a same plane and a same memory die at which the single blocks were located prior to the revector.

24. The at least one non-transitory computer readable storage medium of claim 19, wherein the instructions, when executed, cause the computing system to repeat the revector for a plurality of initial data bands that span the plurality of memory dies.

* * * * *